United States Patent
Beinglass et al.

(10) Patent No.: US 6,402,850 B1
(45) Date of Patent: Jun. 11, 2002

(54) DEPOSITING POLYSILICON FILMS HAVING IMPROVED UNIFORMITY AND APPARATUS THEREFOR

(75) Inventors: Israel Beinglass, Sunnyvale; Mahalingam Venkatesan, San Jose; Christian M. Gronet, San Carlos, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/300,111

(22) Filed: Sep. 2, 1994

Related U.S. Application Data

(63) Continuation of application No. 08/003,707, filed on Jan. 13, 1993.

(51) Int. Cl.[7] .............................................. C23C 16/00
(52) U.S. Cl. ......................... 118/728; 118/725; 156/345
(58) Field of Search .......................... 156/345; 118/725, 118/728, 730, 724

(56) References Cited

U.S. PATENT DOCUMENTS

| | | | | |
|---|---|---|---|---|
| 4,615,755 A | * | 10/1986 | Tracy | 156/345 |
| 4,796,562 A | * | 1/1989 | Brors | 118/725 |
| 4,951,601 A | | 8/1990 | Maydan et al. | 118/719 |
| 4,990,374 A | * | 2/1991 | Keeley | 118/725 |
| 5,104,694 A | | 4/1992 | Saito et al. | 427/255 |
| 5,269,847 A | * | 12/1993 | Anderson | 118/715 |

FOREIGN PATENT DOCUMENTS

| | | | | |
|---|---|---|---|---|
| DE | 4013143 | | 4/1990 | C23C/16/44 |
| EP | 489439 | | 5/1991 | C23C/16/44 |
| EP | 473067 | | 8/1991 | C23C/16/44 |
| JP | 59-112611 | | 6/1984 | C23C/16/52 |
| JP | 61194176 | * | 8/1986 | 118/728 |
| JP | 2-246322 | | 10/1990 | H01L/21/205 |
| JP | 402246322 | * | 10/1990 | 118/725 |

OTHER PUBLICATIONS

"Silicon Processing for the VLSI Era vol. 1" Wolf—p125 1985.*
EP Search Report for apptn 93310367.3 dated May 31, 1994.

* cited by examiner

Primary Examiner—Matthew Smith
Assistant Examiner—Renzo N. Rocchegiani
(74) Attorney, Agent, or Firm—Birgit E. Morris

(57) ABSTRACT

A barrier to prevent reactant gases from reaching the surfaces of a susceptor support for a substrate upon which polysilicon films are to be deposited provides improved uniformity of the depositing film across the substrate, and prevents substrate-to-substrate variations during sequential depositions. A suitable barrier includes a preheat ring extension that mates with an extension of the susceptor support.

3 Claims, 2 Drawing Sheets

DEPOSITING POLYSILICON FILMS HAVING IMPROVED UNIFORMITY AND APPARATUS THEREFOR

This is a continuation of U.S. application Ser. No. 08/003,707 filed Jan. 13, 1993.

This invention relates to an improved method and apparatus for depositing polysilicon onto silicon substrates. More particularly, this invention relates to a single substrate processing chamber for depositing a polysilicon layer having improved uniformity onto semiconductor substrates and method therefor.

BACKGROUND OF THE INVENTION

Doped or undoped silicon layers have been deposited onto silicon substrates, such as silicon wafers, using a low pressure chemical vapor deposition (CVD) process. A reaction gas mixture including a source of silicon, such as silane, disilane, silicon tetrachloride and the like, and optionally a dopant gas such as phosphine, arsine, diborane and the like, and optionally including a carrier gas such as hydrogen, is heated and passed over a silicon substrate to deposit a silicon film on the surface of the substrate. The exact crystallographic nature of the deposited silicon depends upon the temperature of deposition. At low reaction temperatures, the deposited silicon is mostly amorphous; when higher deposition temperatures are employed, a mixture of amorphous silicon and polysilicon or polysilicon alone will be deposited.

The prior art methods use comparatively low pressures of about 200–400 millitorr for this process. Good quality films can be formed, but very low deposition rates of about 100 angstroms/min for undoped, and about 30 angstroms/min for doped, polysilicon are obtained. This low deposition rate can be overcome by processing a plurality of wafers, i.e., up to 100, at once in a batch-type processing chamber.

However, present day thin film equipment for the semiconductor industry has been moving toward single substrate processing, because the processing chambers can be made smaller and processing can be better controlled. Further, modern semiconductor vacuum processing systems have been developed to carry out more than one processing step on a substrate without removing the substrate from a vacuum environment. The use of such vacuum systems results in a reduced number of particulates that contaminate the surface of the wafers during processing, thereby improving the device yield. Such vacuum systems include a central robotic transfer chamber connected to various processing chambers, such as the Applied Materials 5000 series processing system described in U.S. Pat. No. 4,951,601 to Maydan et al.

Thus CVD equipment for single substrate processing to deposit polysilicon onto semiconductor substrates are coming into commercial use. A CVD chamber for such purpose has been described heretofore and will be described with reference to FIG. 1.

Referring to FIG. 1, a single substrate reactor 31 has a top wall 32, side walls 33 and a bottom wall 34 that define the reactor 31 into which a single substrate 35, such as a silicon wafer, can be loaded. The substrate 35 is mounted on a pedestal or susceptor 36 that is rotated by a motor 37 to provide a time averaged environment for the substrate 35 that is cylindrically symmetric. A preheat ring 40 is supported in the chamber 30 and surrounds the wafer 35. The wafer 35 and the preheat ring 40 are heated by light from a plurality of high intensity lamps 38 and 39 mounted outside of the reactor 31. The top wall 32 and the bottom wall 34 of the chamber 30 are substantially transparent to light to enable the light from the external lamps 38 and 39 to enter the reactor 31 and heat the susceptor 36, the substrate 35 and the preheat ring 40. Quartz is a useful material for the top wall 32 and the bottom wall 34 because it is transparent to light of visible and IR frequencies; it is a relatively high strength material that can support a large pressure difference across these walls; and because it has a low rate of outgassing.

During deposition, the reactant gas stream flows from a gas input port 310, across the preheat ring 40 where the gases are heated, across the surface of the substrate 35 in the direction of the arrows 41 to deposit silicon films thereon, and into an exhaust port 311. The gas input port 310 is connected to a gas manifold (not shown) that provides one or a mixture of gases to enter the reactor 31 via a plurality of pipes into this slot. The locations of the input ends of these pipes, the gas concentrations and/or flow rate through each of these pipes are selected to produce reactant gas flows and concentration profiles that optimize processing uniformity. Although the rotation of the substrate and thermal gradients caused by the heat from the lamps 38 and 39 can significantly affect the flow profile of the gases in the reactor 31, the dominant shape of the flow profile is a laminar flow from the gas input port 310 and across the preheat ring 40 and the substrate 35 to the exhaust port 311.

In a typical process producing an undoped silicon layer on a silicon wafer, a pressure of about 80 Torr in a vacuum chamber is maintained by feeding hydrogen at about 10 liters/min into the chamber and adding about 500 sccm of silane at a temperature of the substrate of about 650° C., as determined by a suitable pyrometer. A polysilicon film can be deposited under these conditions at a rate of about 2000 angstroms/min. The higher pressures used in the above method improves the rate of deposition of doped or undoped polysilicon.

While a great improvement in terms of deposition rate has been achieved using the above-described single substrate deposition chamber of FIG. 1 and a high pressure process, the uniformity of the deposited film and the variations in film thickness, sheet resistivity and the like from one substrate to another is not totally satisfactory. Thus it is desired to provide a single substrate CVD chamber to deposit polysilicon films having improved uniformity onto a substrate; and to improve the wafer to wafer uniformity of the substrates.

SUMMARY OF THE INVENTION

We have found that the uniformity of polysilicon films deposited on a substrate can be improved, and wafer-to-wafer variations can be reduced, by preventing processing gases from passing to the backside of the substrate support or susceptor. We found that deposits of solid materials onto the backside of the susceptor leads to non-uniformities of film thickness and film properties of the films deposited onto the substrates. It is believed these deposits cause temperature variations across the surface of the susceptor by varying the rate of heating of the susceptor, which lead to non-uniformities of film thickness, and, as the solids build up on the backside of the susceptor, temperature variations during sequential depositions occur that cause wafer-to-wafer variations in film thickness and film properties.

By providing a barrier to the flow of reactant gases to the backside of the susceptor, these backside deposits and temperature variations are prevented and more uniform polysilicon films are obtained. Wafer-to-wafer variations in film thickness and properties are also prevented or minimized.

DETAILED DESCRIPTION OF THE PRESENT INVENTION

Figure 1:
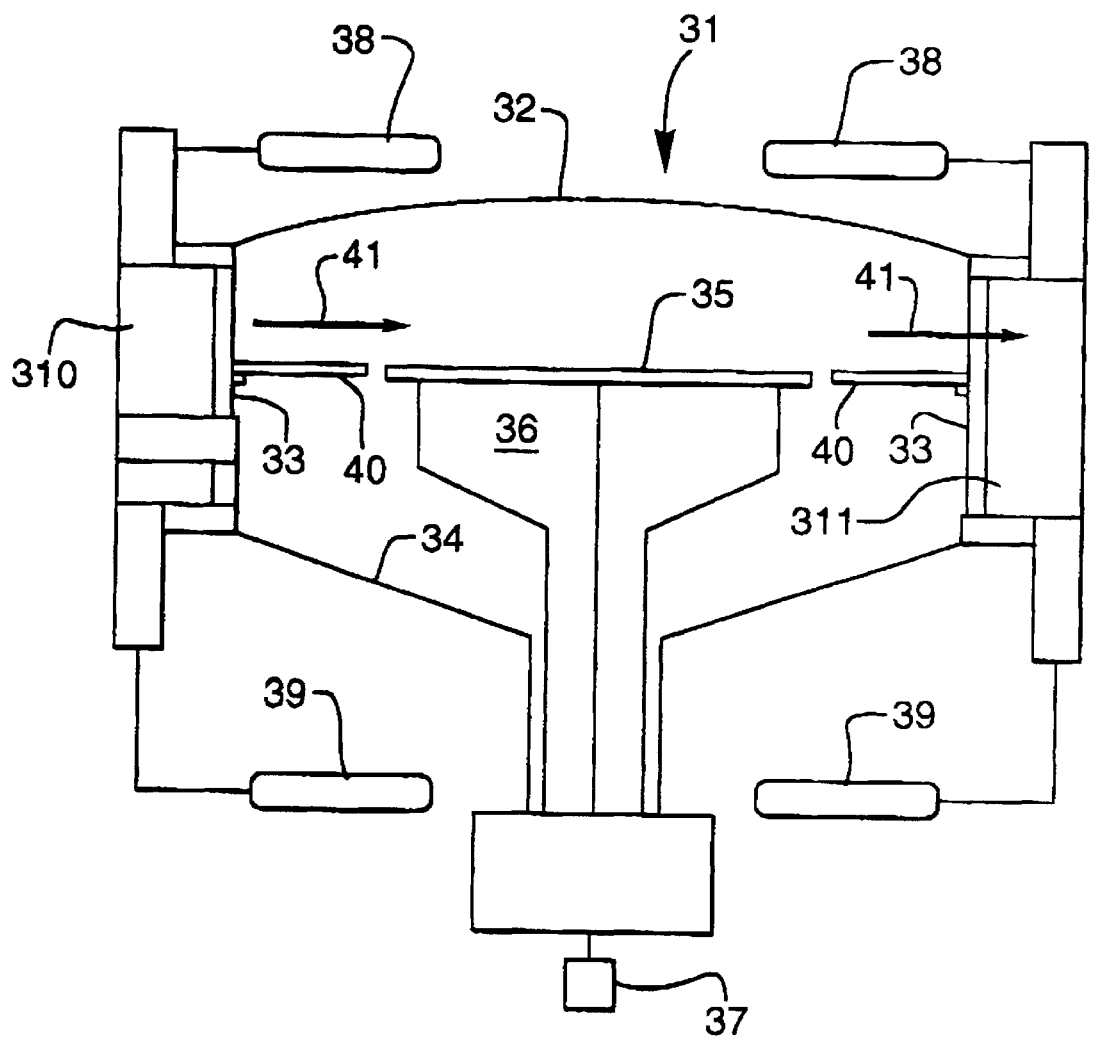
FIG. 1 is a cross sectional partially schematic view of a single substrate deposition chamber of the prior art.
Figure 2:
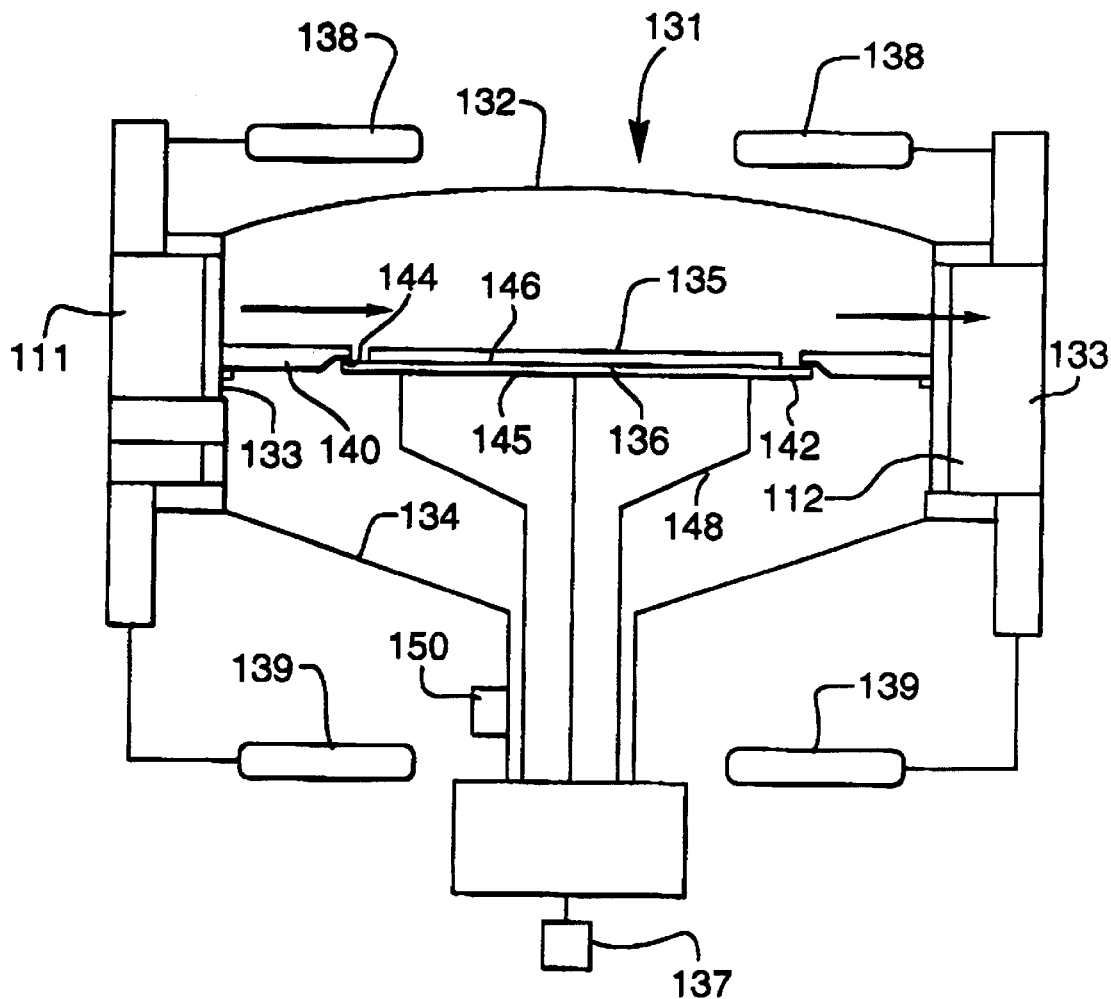
FIG. 2 is a cross sectional partially schematic view of a single substrate deposition chamber illustrating an embodiment of the present invention.

An embodiment illustrating one means of preventing backside deposition on the deposition chamber susceptor is shown and will be discussed with reference to FIG. 2.

A single substrate reactor 131 has a top wall 132, side walls 133 and a bottom wall 134. The top wall 132 and the bottom wall 134 are made of quartz. Outside of the reactor 131 are a plurality of high intensity lamps 138 and 139 which heat the preheat ring 140, a susceptor 136 and a substrate 135 on which a polysilicon film is to be deposited. The susceptor 136 is a flat plate having an upper surface 146 and a backside surface 145. A susceptor support 148 supports the susceptor 136. A reactant gas input port 111 and an exhaust port 112, situate in opposite sidewalls 133, ensure a laminar gas flow across the preheat ring 140 and the substrate 135.

Figure 3:
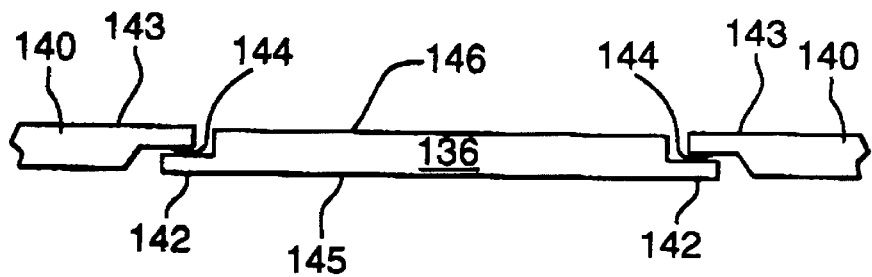
FIG. 3 is a cross sectional view of a one embodiment of a reactant gas barrier of the invention.

As shown in greater detail in FIG. 3, the susceptor 136 has an extension 142, that can be built into the sidewall of the susceptor 136 or mounted on the outside thereof. The preheat ring 140 has an extension 144 in the upper surface 143 thereof that mates with the extension 142 of the susceptor 136. The mating extensions 142 and 144 provide a barrier that prevents or greatly reduces the amount of reaction gases that can pass into the gap between them and deposit solid material onto the backside surface 145 of the susceptor 136.

We believe that deposits of doped or undoped silicon or other solid materials onto the backside of the susceptor cause temperature variations across the susceptor 136, which deposits in turn cause variations in film thickness and properties of the depositing polysilicon films.

Further, a buildup of material on the backside 145 of the susceptor 136 causes incorrect temperature readings of the substrate 135 during deposition, also affecting the nature and deposition rate of the depositing films. The temperature of the susceptor 136 is determined by means of a pyrometer 150 which is mounted on the outside of the chamber 131 and above the lamps 139. The pyrometer 150 is sensitive to the emissivity of the backside surface 145 of the susceptor 136. If the emissivity of the backside surface 145 of the susceptor 136 changes due to deposition of various materials thereon, the pyrometer 150 obtains a varying signal and thus gives an erroneous temperature reading. Thus the emissivity of the backside surface 145 of the susceptor 136 must be kept as constant as possible.

Still further, as the buildup of material on the backside surface 145 continues during sequential substrate processing, a wafer-to-wafer variation in the deposited films also occurs, which variation desirably is kept as small as possible.

By causing the preheat ring and susceptor extensions to overlap and mate with each other, a barrier is provided whereby reactant gases are prevented from reaching the susceptor surfaces and depositing solids thereon. Thus temperature variations across the substrate, and on the susceptor, are reduced, and temperature readings of the substrate during deposition are more accurate than in prior art deposition chambers.

The processing chamber of the invention can be employed alone or, preferably, can be part of a multi-chamber vacuum processing system as described above. In that case the processing chamber of the invention has a port in a sidewall thereof for transferring substrates into and out of the chamber from a central transfer chamber.

Although the present invention has been described in terms of a single substrate processing chamber, variations in equipment and design can be made by one skilled in the art and are meant to be included herein. The invention is only to be limited by the scope of the appended claims.

We claim:

1. In a chemical vapor deposition chamber comprising in combination a susceptorsupport for a substrate to be processed, a preheat ring surrounding said susceptor support, a plurality of external heating lamps for heating the susceptor support, the substrate thereon and the preheat ring, a source of precursor gas that provides laminar flow of the gas sequentially across the preheat ring and the substrate to an exhaust port, wherein said susceptor has an extension between the support surface and the backside thereof to form a reactant gas barrier preventing reaction gases from reaching the backside surface of said susceptor wherein said preheat ring has an extension in its upper surface that overlaps and mates with said susceptor extension.

2. A chamber according to claim 1 including means for rotating said susceptor support.

3. A chamber according to claim 1 including a port in a sidewall thereof for transfer of the substrate into and out of the chamber.

* * * * *